(12) United States Patent
Bae et al.

(10) Patent No.: US 8,774,336 B2
(45) Date of Patent: Jul. 8, 2014

(54) LOW-POWER HIGHLY-ACCURATE PASSIVE MULTIPHASE CLOCK GENERATION SCHEME BY USING POLYPHASE FILTERS

(71) Applicants: Korea Advanced Institute of Science and Technology, Daejeon (KR); TeraSquare Co., Ltd., Seoul (KR)

(72) Inventors: Hyeon Min Bae, Seoul (KR); Hyo Sup Won, Daejeon (KR); Joon Yeong Lee, Gangwon-Do (KR); Jin Ho Park, Seoul (KR); Tae Ho Kim, Daejeon (KR)

(73) Assignee: TeraSquare Co., Ltd., Seoul (KR)

( * ) Notice: Subject to any disclaimer, the term of this patent is extended or adjusted under 35 U.S.C. 154(b) by 0 days.

(21) Appl. No.: 13/833,407

(22) Filed: Mar. 15, 2013

(65) Prior Publication Data

US 2013/0266103 A1    Oct. 10, 2013

Related U.S. Application Data

(60) Provisional application No. 61/617,181, filed on Mar. 29, 2012.

(51) Int. Cl.
  *H04L 7/00*    (2006.01)
  *H04L 7/02*    (2006.01)

(52) U.S. Cl.
  USPC ........................................... 375/354; 375/359

(58) Field of Classification Search
  USPC .......................................... 375/354, 359, 324
  See application file for complete search history.

(56) References Cited

U.S. PATENT DOCUMENTS

| | | | |
|---|---|---|---|
| 6,441,761 B1* | 8/2002 | Viswanathan | 341/144 |
| 8,415,996 B1* | 4/2013 | Wong | 327/152 |
| 2002/0009170 A1* | 1/2002 | Schmatz | 375/371 |
| 2007/0018728 A1* | 1/2007 | Volkov | 330/254 |
| 2008/0107212 A1* | 5/2008 | Baumgartner et al. | 375/340 |
| 2011/0060226 A1* | 3/2011 | Yen et al. | 600/472 |
| 2011/0294454 A1* | 12/2011 | Robert | 455/323 |

* cited by examiner

*Primary Examiner* — Chieh M Fan
*Assistant Examiner* — Brian J Stevens
(74) *Attorney, Agent, or Firm* — Marshall, Gerstein & Borun LLP (57) ABSTRACT

Exemplary embodiments of the present invention relate to a low-power highly-accurate passive multiphase clock generation scheme by using polyphase filters. An exemplary embodiment of the present invention may be low power phase-rotator-based 25 GB/s CDR architecture in case that half-rate reference clock is provided. It may be suitable for multi-lane scheme and incorporate phase interpolator with improved phase accuracy to make Nyquist-sampling clock phase. To improve the phase accuracy, poly phase filter may be used for converting 4-phase to 8-phase and interpolate adjacent 45 degree different phases. The linearity of phase rotator may be improved by proposed harmonic rejection poly phase filter (HRPPF) using the characteristic of notch filter response.

8 Claims, 7 Drawing Sheets

LOW-POWER HIGHLY-ACCURATE PASSIVE MULTIPHASE CLOCK GENERATION SCHEME BY USING POLYPHASE FILTERS

BACKGROUND OF THE INVENTION

1. Field of the Invention

Exemplary embodiments of the present invention relate to a low-power highly-accurate passive multiphase clock generation scheme by using polyphase filters.

2. Discussion of the Background

Parallel 25 Gb/s I/O is becoming the mainstream I/O of choice because of the degradation in the signal integrity above 25 GB/s in current board-level assembly technology. For a parallel receiver design, phase rotator-based phase locked loop (PLL) is more suitable than VCO-based counterparts in terms of power consumption, area, and operational stability. However, clock signal(s) generated by the VCO should be transferred to the phase rotators in each channel, which consumes a large amount of power.

A phase rotator requires at least four phase clock signals for proper operation. Such multiphase clock signals can be directly delivered from the VCO or locally created in each channel. The four phase clock signals should have low harmonic distortion for accurate phase interpolation. Typically various type of low-pass filters are incorporated prior to the phase rotators for the harmonic filtering. However, such technique is inappropriate for high-resolution phase interpolators due to limited phase linearity.

The usage of multiphase clock signals for the data sampling is a common low-power technique. In order to incorporate such design technique in rotator-based CDR (Clock-and-Data Recovery) designs, the phase-rotated clock signal should be converted to multiphase clock signals. Typically multiphase clock signals are created by using a delay locked loop (DLL) or an injection locked oscillator (ILO). However, area penalty and operational instability are nontrivial issues. A multiphase generation by using phase interpolators is a plausible approach when four phase clock signals are present. However, this approach suffers from state-dependent phase inaccuracy.

SUMMARY OF THE INVENTION

An exemplary embodiment of the present invention discloses a CDR (Clock-and-Data Recovery) apparatus for low-power highly accurate multiphase clock generation by using polyphase filter, the CDR apparatus comprising: phase rotators configured to output arbitrary phases by weighted average for current wherein the phase rotators requiring multiphase clock signals, phase interpolators configured to output arbitrary phases by weighted average for current wherein a ratio of the weighted average for current is fixed, a 1st polyphase filter being connected to the phase rotators for making the multiphase clock signals to be sinusoidal, and a 2nd polyphase filter being connected between the phase rotators and the phase interpolators for delaying the multiphase clock signals.

The 1st polyphase filter eliminates a dominant harmonic distortion.

The dominant harmonic distortion is a third harmonic distortion.

The 1st polyphase filter is HRPPF (Harmonic Rejection Polyphase Filter).

The HRPPF rejects high order harmonics of the clock signals by using a characteristic of notch filter response.

The 2nd polyphase filter creates Nyquist rate sampling clock signals.

The 2nd polyphase filter separates adjacent clock phases to be interpolated with identical weights.

The multiphase clock signals are at least four phase clock signals.

The 2nd polyphase filter is 8-phase polyphase filter used for converting 4-phase to 8-phase.

The CDR further comprises, a binary to thermometer connected to the phase rotator.

The CDR further comprises, a phase accumulator connected to the binary to thermometer.

The CDR further comprises, a Bang-bang Logic connected to the phase accumulator.

The CDR further comprises, a multiphase divider connected to the 1st polyphase filter.

The phase rotator employs a constant current in a current source.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED OF THE ILLUSTRATED EMBODIMENTS

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

Figure 1:
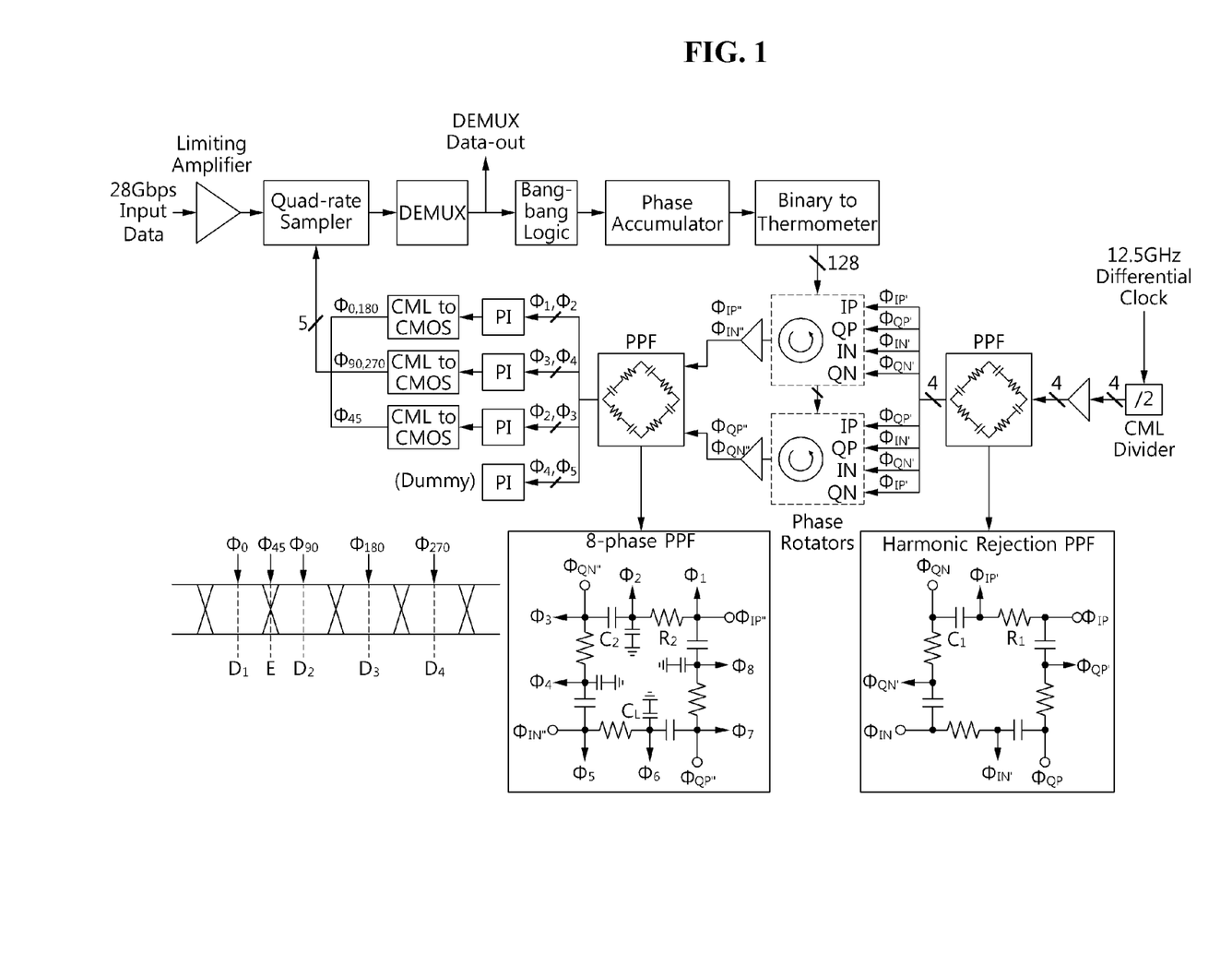
FIG. 1 shows architecture of 25 Gb/s CDR(Clock-and-Data Recovery).

FIG. 1 shows architecture of 25 Gb/s CDR(Clock-and-Data Recovery). FIG. 1 may depict the block diagram of a typical quadrate CDR together with the proposed multiphase clock generation/distribution scheme. The CDR may extract clock and data from input signal. The CDR may consist of a quad-rate sampler, a deserializer (DEMUX), CDR Logics (for example, Bang-bang Logic, phase accumulator and binary to thermometer) and a clock tree. Each block in FIG. 1 may have functions as shown below.

"Phase Rotator" can output $2^N$ arbitrary phases by weighted average for current and the phase can be dynamically output with a digital control always. "Phase Interpolator (PI)" may have a same mechanism with the Phase Rotator but, here the ratio of the weighted average for current may be fixed. "CML to CMOS" may be a block to transform the low level signal of the CML (Current mode logic) output to the rail-to-rail full-swing signal. The output of this block can be used for a clock for Sampler. "Sampler" may be a generic sense-amp and it may work as a Comparator for ADC (Analog to Digital Convertor). "Polyphase filter" may be comprised of a generic 1-stage passive RC. The 1st polyphase filter and the 2nd polyphase filter may have different rolls. For example, 1st polyphase filter may be HRPPF (Harmonic Rejection Polyphase Filter) and 2nd polyphase filter may be 8-phase PPF.

PLL having a generic phase rotator may have to conduct a frequency doubling to enable the Nyquist sampling during a phase rotation when the baud-rate clock is given. Since the input for phase rotator may have 4-phase, the given baud-rate clock may be divided by 2 using a multiphase divider to construct 6.25 GHz 4-phase. Then, the output of the multiphase divider may pass the 1st polyphase filter. It is because the input clock for phase rotator may be preferred to be sinusoidal to allow a better interpolation and linearity (precise intervals between the states). Since the frequency response of the polyphase filter basically may represent a type of notch filter, it can reduce harmonics. 6.25 GHz 4-phase clock may be obtained by the two Phase Rotators, and it may be inputted to the PIs to get 6.25 GHz 8-phase. However, it may be a disadvantage that the intervals in the 8-phases can be irregular due to the PVT (Process, Voltage and Temperature) variation and the clock frequency. To compensate for the disadvantage, by using the 2nd polyphase filter prior to the PIs, the intervals in 8-phases may be stable under PVT variation and the clock frequency. Finally, the "CML to CMOS" converter may be added to transform the signal to the rail-to-rail Sampler clock.

There may be two reasons to use only 5-phases clock out of 8-phases in Quad-rate Sampler: 1) bang-bang phase detection for phase locking may be possible with the 4-phases for DATA sampling and the 1-phase for EDGE sampling, and 2) it can reduce idling jitter originated from a phase mismatch that occurs after the phase locking.

A single half rate clock signal may be distributed to each channel and divided for multiphase generation. The output of the multiphase divider, for example CML divider in this case, may contain a large amount of harmonics, which may degrade phase domain linearity of the phase rotator.

Usually for clock recovery, quad-rate bang-bang phase detector may sample 4-data ($\Phi_0$, $\Phi_{90}$, $\Phi_{180}$, $\Phi_{270}$) and 4-edge ($\Phi_{45}$, $\Phi_{135}$, $\Phi_{225}$, $\Phi_{315}$) but in this design, only one edge ($\Phi_{45}$) may be used every 4-bit period for saving the power consumption and preventing increasing output clock jitter by phase deviation of multi-phase clock. The direction of phase rotation (UP/DOWN) may be calculated in Bang-bang Logic by sampled data and edge. UP/DOWN may be accumulated in Phase Accumulator and converted from binary to thermometer codes, which may be control input of phase rotator.

The proposed clock process may provide the 6.25 GHz quad-rate sampling clock of 4-data ($\Phi_0$, $\Phi_{90}$, $\Phi_{180}$, $\Phi_{270}$) and 1-edge ($\Phi_{45}$) which may be locked to the input phase by phase rotation of phase rotator. But the CML divider output may not be guaranteed that it is enough sinusoidal for the subsequent phase rotator to linearly interpolate the clock in all PVT variations and wide frequency range, because of non-linearity of circuit.

The input signal outputted from multiphase divider to the phase rotator can be described as a polynomial as given by the following Equation 1.

$$I(t) = \cos\omega t + a\cos^3\omega t + b\cos^5\omega t \qquad \text{[Equation 1]}$$
$$= \left(1 + \frac{3}{4}a + \frac{5}{8}b\right)\cos\omega t + \left(\frac{1}{4}a + \frac{5}{16}b\right)\cos3\omega t +$$
$$\frac{1}{16}b\cos5\omega t$$

$$Q(t) = \sin\omega t + a\sin^3\omega t + b\sin^5\omega t \qquad \text{[Equation 2]}$$
$$= \left(1 + \frac{3}{4}a + \frac{5}{8}b\right)\sin\omega t - \left(\frac{1}{4}a + \frac{5}{16}b\right)\sin3\omega t +$$
$$\frac{1}{16}b\sin5\omega t$$

wherein I(t) and Q(t) may denote in-phase and quadrature phase clock signals, respectively. Both I(t) and Q(t) may be considered up to the 5th harmonics for simplicity. By using Equation 1 and Equation 2, the complex domain representation of the clock signal may be shown as the following Equation 3.

$$V_{in}(t) \equiv I(t) + jQ(t) \qquad \text{[Equation 3]}$$
$$= \left(1 + \frac{3}{4}a + \frac{5}{8}b\right)e^{j\omega t} + \left(\frac{1}{4}a + \frac{5}{16}b\right)e^{-3j\omega t} +$$
$$\frac{1}{16}be^{5j\omega t}$$

Equation 3 may show that the dominating 3rd harmonic exists at negative frequency. In order to eliminate the 3rd harmonic and improve the spurious free dynamic range (SFDR), a 1st-order HRPPF may be employed as the 1st polyphase filter prior to the phase rotator. To improve the linearity of phase rotator, the proposed HRPPF may reject the high order harmonics of clock by using the characteristic of notch filter response and make clock more sinusoidal. The transfer function of theist-order PPF in complex domain may be shown as the following Equation 4.

$$H(j\omega) = \frac{1 + \omega R_1 C_1}{1 + j\omega R_1 C_1} \qquad \text{[Equation 4]}$$

wherein $R_1$ and $C_1$ may be the resistance and capacitance of the HRPPF in FIG. 1. The PPF may have a null shown as the following Equation 5.

$$f_{null} = -\frac{1}{2\pi R_1 C_1} \qquad \text{[Equation 5]}$$

The location of the null frequency can be adjusted via R and C in the PPF. The proposed HRPPF scheme may be similar to image reduction techniques common in wireless communication systems.

Figure 2A:
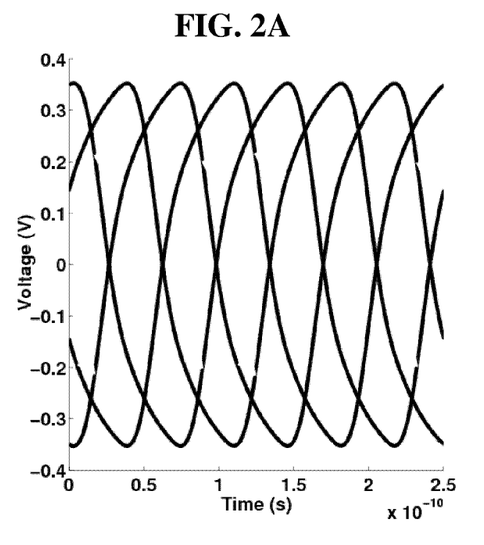
FIG. 2A and FIG. 2B shows simulated transient results of HRPPF (harmonic rejection poly phase filter) according to an exemplary embodiment of the present invention.
Figure 2B:
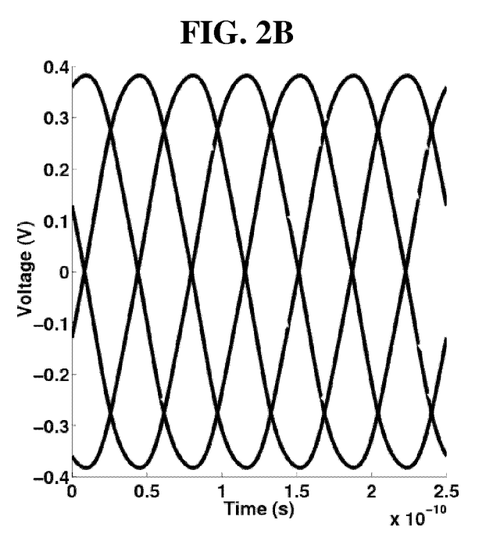
Figure 3:
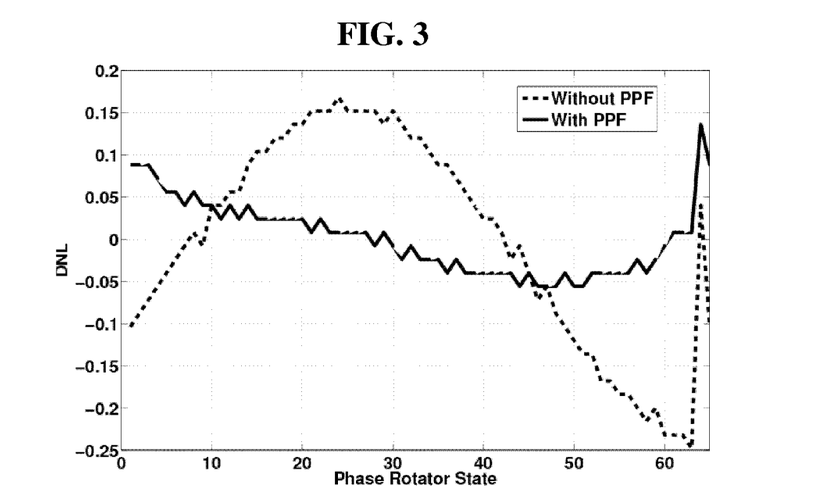
FIG. 3 shows a DNL (Differential Non-Linearity) of the phase rotator according to an exemplary embodiment of the present invention.

FIG. 2A AND FIG. 2B shows simulated transient results of HRPPF (harmonic rejection poly phase filter) according to an exemplary embodiment of the present invention. FIG. 3 shows a DNL (Differential Non-Linearity) of the phase rotator according to an exemplary embodiment of the present invention.

FIG. 2A shows an input for HRPPF, and FIG. 2B shows an output for the input of FIG. 2A at 7 GHz. The SFDR of the clock signal may be improved from 18 dB to 37 dB and, especially, the 3rd harmonic may be reduced by 43 dB. As a result, the linearity of the phase rotator may be improved significantly as shown in FIG. 3.

The phase rotation of the phase rotator may be achieved by taking the weighted average of the two quadrature clock signals dynamically. Thermometer coded weight may be used to reduce the switching glitches in the current source.

The two phase rotators may generate 4-phase rotated clock controlled by the shared control signal from CDR logics. The 4-phase rotated clock, which is systematically aligned, may be used for data sampling phase, other 1-edge sampling clock may be obtained by interpolation of 2-data clock phases. The phase interpolation may be achieved by taking the weighted average of the two adjacent clock signals in 1:1 fixed ratio. But interpolation may depend on non-ideality of PI, the generated edge-clock may have the phase error, which indicates being off the center of 2-data phases. The phase error may cause not sampling the center of eye in phase locking state and the performance drop of BER and jitter tolerance for high frequency jitter. The phase error may consist of static phase error and dynamic phase error. The static phase error may be caused by non-linearity of phase interpolator which is mainly determined by input shape. The dynamic phase error may be caused by dynamically changed input shape, which is output of the phase rotator. For minimizing these phase error, a 2nd PPF before the PIs may be applied.

Figure 4:
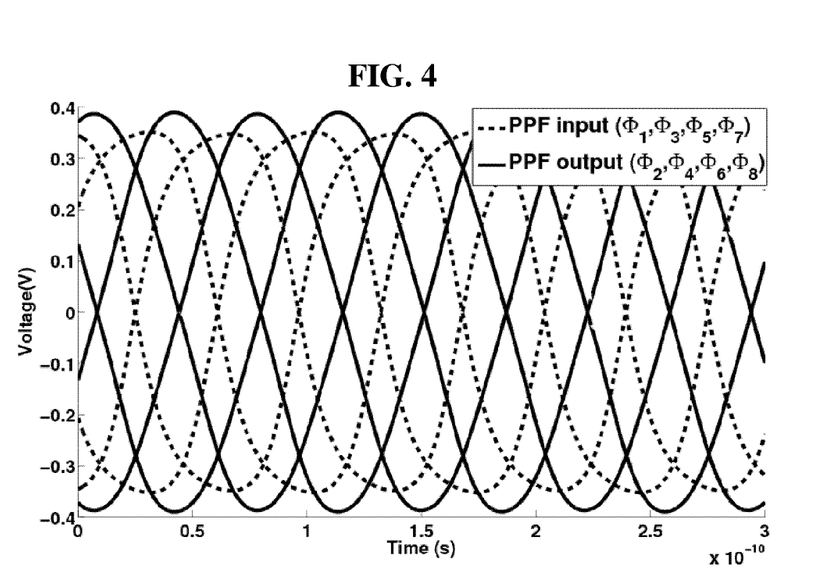
FIG. 4 shows simulated transient results of input/output 8-phase PPF (Polyphase Filter) according to an exemplary embodiment of the present invention.

FIG. 4 shows simulated transient results of input/output 8-phase PPF (Polyphase Filter) according to an exemplary embodiment of the present invention. Herein the 8-phase PPF may be used for converting 4-phase to 8-phase and interpolate adjacent 45 degree different phases.

Two phase rotators may generate 4-phase quarter rate dynamically rotated clock signals. Nyquist rate sampling clock signals can be directly achieved by interpolating such four phase clock signals. However, the accuracy may be sensitive to process variations and waveform of the phase rotator. In order to overcome such problem, a 2nd polyphase filter may be employed to create Nyquist rate sampling clock signals, and adjacent clock phases separated by 45 degrees may be interpolated with identical weights. The transfer function of the 1st-order PPF with the output loading capacitance of $C_L$ may be shown as the following Equation 6.

$$H(j\omega) = \frac{1 + \omega R_2 C_2}{1 + j\omega R_2 (C_2 + C_L)} \quad \text{[Equation 6]}$$

wherein $R_2$ and $C_2$ may be the resistance and capacitance of the 8-phase PPF in FIG. 1.

Figure 5:
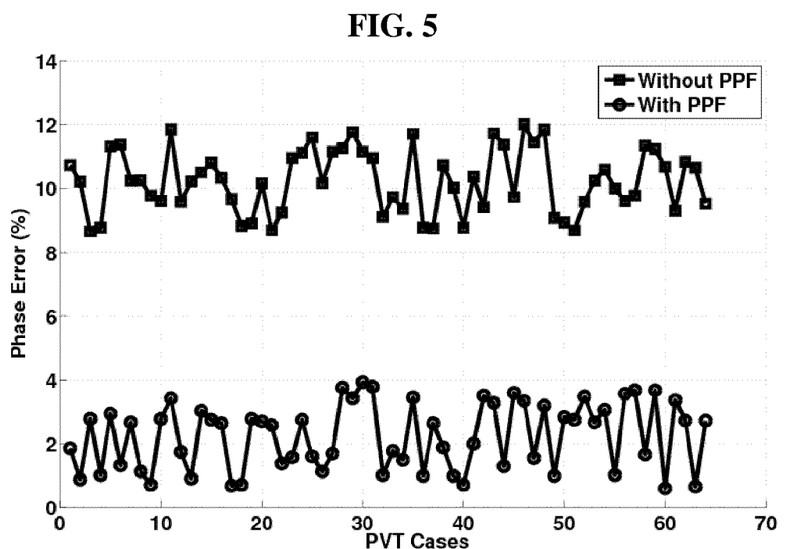
FIG. 5 shows a static phase error under various PVT (Process, Voltage and Temperature) cases according to an exemplary embodiment of the present invention.
Figure 6:
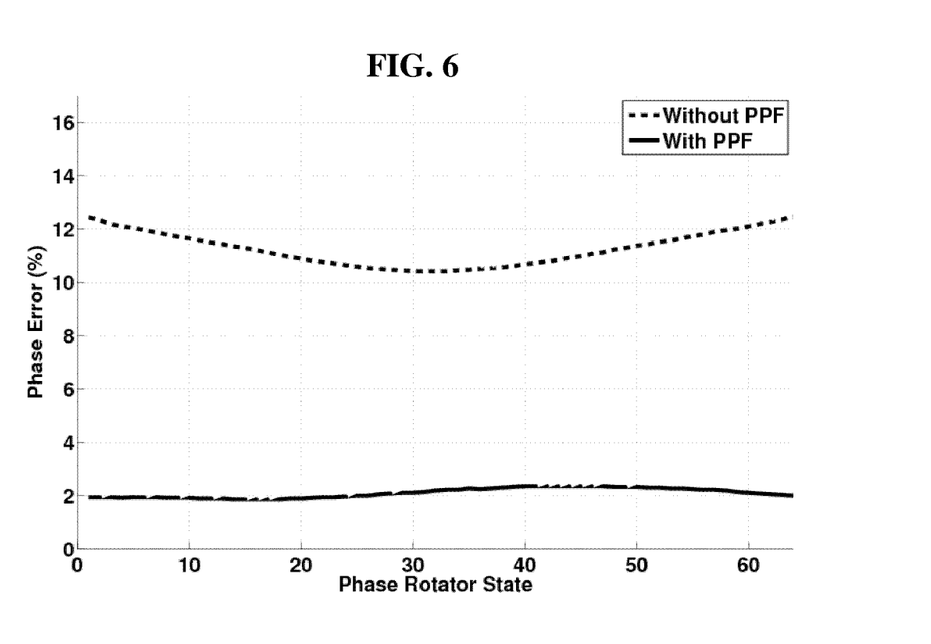
FIG. 6 shows a dynamic phase error under various PR state according to an exemplary embodiment of the present invention.

FIG. 5 shows a static phase error under various PVT (Process, Voltage and Temperature) cases according to an exemplary embodiment of the present invention. FIG. 6 shows a dynamic phase error under various PR state according to an exemplary embodiment of the present invention.

In order to create 45 degree phase shift, which is equivalent to 0.5 UI, R and C in PPF may be satisfy the following Equation 7.

$$f_{clock} = \frac{1}{2\pi R_2 (C_2 + C_L)} \quad \text{[Equation 7]}$$

wherein $f_{clock}$ may be the pole location of the PPF. Simulation may indicate that the static phase error is reduced by ⅕ as shown in FIG. 5 and the dynamic phase error is reduced by ¼ as shown in FIG. 6. The phase error may be defined as $$\frac{\sigma_{dev}}{0.5 UI}.$$

An exemplary embodiment of the present invention may describe a low-power highly-accurate passive multiphase clock generation and distribution scheme by using polyphase filters. This scheme may not require a DLL and an ILO and sampling clock phases can be adjusted without hardware overhead.

A single half-rate differential clock signal may be distributed to each channel and locally converted to four-phase quarter-rate clock signals by using a multiphase clock divider. A HRPPF prior to the phase rotator may eliminate the dominant third harmonic distortion in the multiphase clock signal and improve the phase linearity of the phase rotator.

Phase-rotated four-phase clock signal may be created by using dual phase rotators. These four-phase clock signals may be converted to eight phase clock signals by using a poly phase filter for the Nyquist rate sampling. Adjacent clock phases separated by 45 degrees may be interpolated for improved phase accuracy. Sampling phase adjustment through the control of the interpolation factor may be a byproduct of this architecture.

The exemplary embodiments according to the present invention may be recorded in computer-readable media including program instructions to implement various operations embodied by a computer. The media may also include, alone or in combination with the program instructions, data files, data structures, and the like. The media and program instructions may be those specially designed and constructed for the purposes of the present invention, or they may be of the kind well-known and available to those having skill in the computer software arts.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A CDR (Clock-and-Data Recovery) apparatus for low-power highly accurate multiphase clock generation by using polyphase filter, the CDR apparatus comprising:
   phase rotators configured to output arbitrary phases by taking a weighted average current dynamically wherein the phase rotators requiring multiphase clock signals;
   phase interpolators configured to output arbitrary phases by weighted average for current wherein a ratio of the weighted average for current is fixed;
   a 1st polyphase filter being connected to the phase rotators for making the multiphase clock signals to be sinusoidal; and
   a 2nd polyphase filter being connected between the phase rotators and the phase interpolators for delaying the multiphase clock signals,
   wherein the 2nd polyphase filter separates adjacent clock phases to be interpolated with identical weights.

2. The CDR apparatus of claim 1, wherein the 1st polyphase filter eliminates a dominant harmonic distortion.

3. The CDR apparatus of claim 2, wherein the dominant harmonic distortion is a third harmonic distortion.

4. The CDR apparatus of claim 1, wherein the 1st polyphase filter is HRPPF (Harmonic Rejection Polyphase Filter).

5. The CDR apparatus of claim 4, wherein the HRPPF rejects high order harmonics of the clock signals by using a characteristic of notch filter response.

6. The CDR apparatus of claim 1, wherein the 2nd polyphase filter creates Nyquist rate sampling clock signals.

7. The CDR apparatus of claim 1, wherein the multiphase clock signals are at least four phase clock signals.

8. The CDR apparatus of claim 7, wherein the 2nd polyphase filter is 8-phase polyphase filter used for converting 4-phase to 8-phase.

* * * * *